(12) United States Patent (10) Patent No.: US 12,347,355 B2
Pan et al. (45) Date of Patent: Jul. 1, 2025

(54) GATE DRIVING CIRCUIT AND DISPLAY PANEL

(71) Applicant: WUHAN CHINA STAR OPTOELECTRONICS TECHNOLOGY CO., LTD., Hubei (CN)

(72) Inventors: You Pan, Hubei (CN); Mang Zhao, Hubei (CN); Qiang Gong, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 18/553,544

(22) PCT Filed: Jul. 31, 2023

(86) PCT No.: PCT/CN2023/110172
§ 371 (c)(1),
(2) Date: Sep. 29, 2023

(87) PCT Pub. No.: WO2025/015634
PCT Pub. Date: Jan. 23, 2025

(65) Prior Publication Data
US 2025/0078710 A1 Mar. 6, 2025

(30) Foreign Application Priority Data
Jul. 18, 2023 (CN) .......................... 202310885898.4

(51) Int. Cl.
*G09G 3/20* (2006.01)
*G11C 19/28* (2006.01)

(52) U.S. Cl.
CPC ............. *G09G 3/20* (2013.01); *G11C 19/287* (2013.01); *G09G 2310/0267* (2013.01); *G09G 2310/0286* (2013.01); *G09G 2330/04* (2013.01)

(58) Field of Classification Search
CPC ............. G09G 3/20; G09G 2310/0267; G09G 2310/0286; G09G 2330/04; G11C 19/287
See application file for complete search history.

(56) References Cited

U.S. PATENT DOCUMENTS

2018/0174541 A1* 6/2018 Takahashi ............ G09G 3/3666
2018/0174542 A1* 6/2018 Zheng .................... G09G 3/006
(Continued)

FOREIGN PATENT DOCUMENTS

CN 103280200 A 9/2013
CN 104240765 A 12/2014
(Continued)

OTHER PUBLICATIONS

International Search Report in International application No. PCT/CN2023/110172, mailed on Apr. 16, 2024.
(Continued)

*Primary Examiner* — Sejoon Ahn
(74) *Attorney, Agent, or Firm* — PV IP PC; Wei Te Chung

(57) ABSTRACT

A gate driving circuit and a display panel are provided. A gate driving unit in the gate driving circuit includes a pull-up control module, a pull-up node, a pull-down control module, a pull-down node, and a pull-down module. The pull-up control module is electrically connected to the pull-up node. The pull-down control module is electrically connected to the pull-down node. The pull-down control module is electrically connected to a scanning signal input terminal of a previous one stage gate driving unit or a scanning signal (Continued)

input terminal of a previous two stage gate driving unit. The pull-down module is electrically connected to the pull-up node and the pull-down node.

14 Claims, 3 Drawing Sheets

(56) References Cited

U.S. PATENT DOCUMENTS

2018/0174545 A1\* 6/2018 Li .................. G09G 3/3688
2018/0174659 A1\* 6/2018 Shao ................ G11C 19/28
2023/0177991 A1 6/2023 Tao

FOREIGN PATENT DOCUMENTS

| | | |
|---|---|---|
| CN | 105304054 A | 2/2016 |
| CN | 106486084 A | 3/2017 |
| CN | 106951123 A | 7/2017 |
| WO | 2023000357 A1 | 1/2023 |

OTHER PUBLICATIONS

Written Opinion of the International Search Authority in International application No. PCT/CN2023/110172, mailed on May 10, 2024.

\* cited by examiner

GATE DRIVING CIRCUIT AND DISPLAY PANEL

CROSS REFERENCE TO RELATED APPLICATION

This application is a National Stage of International Application No. PCT/CN2023/110172, filed on 2023 Jul. 31, which claims priority to Chinese Application No. 202310885898.4, filed on 2023 Jul. 18, both of which are incorporated by reference herein.

FIELD

The present disclosure generally relates to the field of display technology, in particular to a gate driving circuit and a display panel.

BACKGROUND

Gate-driver On Array (GOA) technology is a driving mode in which a gate driving circuit is fabricated on a thin film transistor array substrate by using a manufacturing procedure of manufacturing a thin film transistor array (Array) so as to realize progressive scanning. The gate drive circuit includes multiple cascaded gate drive units.

The grid driving unit includes a pull-up node and a pull-down node. The pull-up node refers to a gate control point of an output transistor in the GOA. When the potential of the pull-up node is a high potential, the output transistor is on, and the gate driving unit outputs a driving signal to a corresponding scanning line. The pull-down node refers to a gate control point of a pull-down control transistor. When the potential of the pull-down node is a high potential, the pull-down control transistor is on, and the gate driving unit stops outputting a driving signal to a corresponding scanning line.

In a conventional gate driving circuit, the potential of the pull-up node and the potential of the pull-down node influence each other. When the potential of the pull-up node is insufficient to turn on the pull-down control transistor to pull down a high potential of the pull-down node, the potential of the pull-up node is in a collision state of being both pulled high and pulled down, resulting in a problem that charging delay exists in the pull-up node.

SUMMARY

An object of some embodiments of the present disclosure is to provide a gate driving circuit and a display panel. The gate driving circuit and the display panel can improve a problem that charging delay exists in a pull-up node.

According to one aspect of some embodiments of the present disclosure, a gate driving circuit includes multiple gate driving units cascaded in a multi-stage series, each stage gate driving unit including a pull-up control module, a pull-up node, a pull-down control module, a pull-down node, and a pull-down module, the pull-up control module being electrically connected to the pull-up node and configured to pull up a potential of the pull-up node; the pull-down control module which disconnects to the pull-up node being electrically connected to the pull-down node, and being configured to pull down a potential of the pull-down node; and the pull-down module being electrically connected to the pull-up node and the pull-down node, and being configured to pull down the potential of the pull-up node under control of the potential of the pull-down node.

According to another aspect of the present disclosure, a display panel includes a pixel unit and a gate driving circuit, the gate driving circuit being electrically connected to the pixel unit, the gate driving circuit including multiple gate driving units cascaded in a multi-stage series, each stage gate driving unit including a pull-up control module, a pull-up node, a pull-down control module, a pull-down node, and a pull-down module; the pull-up control module being electrically connected to the pull-up node, and being configured to pull up a potential of the pull-up node; the pull-down control module which disconnects to the pull-up node being electrically connected to the pull-down node, and being configured to pull down a potential of the pull-down node; the pull-down module being electrically connected to the pull-up node and the pull-down node, and being configured to pull down the potential of the pull-up node under control of the potential of the pull-down node.

BENEFICIAL EFFECT

In the gate driving circuit and the display panel according to the embodiments of the present disclosure, the gate driving circuit includes multiple gate driving units cascaded in a multi-stage series. Each stage gate driving unit includes a pull-up control module, a pull-up node, a pull-down control module, a pull-down node, and a pull-down module. The pull-up control module is electrically connected to a scanning signal input terminal of a previous one stage gate driving unit and the pull-up node. The pull-up control module is configured to pull up the potential of the pull-up node. The pull-down control module which disconnects to the pull-up node is electrically connected to the pull-down node, and is configured to pull down the potential of the pull-down node. The pull-down module is electrically connected to the pull-up node and the pull-down node. The pull-down module is configured to pull down the pull-up node potential under control of the potential of the pull-down node. In the gate driving circuit, the pull-down control module is configured to be electrically connected to the scanning signal input terminal of a previous one stage gate driving unit or a scanning signal input terminal of a previous two stage gate driving unit, making the potential of the pull-down node is controlled by the potential of the scanning signal inputted by the scanning signal input terminal of a previous one stage gate driving unit or the scanning signal input terminal of a previous two stage gate driving unit, without being controlled by the potential of the pull-up node, so as to improve a problem that charging delay exists in a pull-up node caused by a high potential of the pull-down node not being pulled down in time.

DETAILED DESCRIPTION

Figure 1:
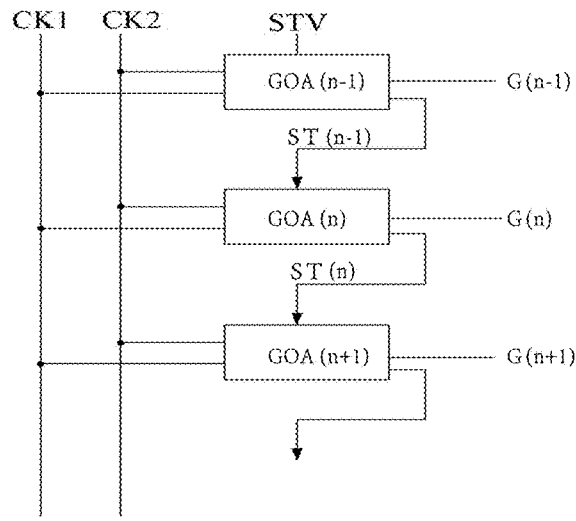
FIG. 1 is a schematic diagram of a gate driving circuit according to some embodiments of the present disclosure.

The technical solution in the embodiments of the present disclosure will be described below in conjunction with the accompanying drawings in the embodiments of the present disclosure. The described examples are merely illustrative and explanatory of the ideas of the present disclosure and should not be construed as limiting the scope of protection of the present disclosure.

A gate driving circuit in a conventional display panel charges a pull-up node in a gate driving unit, so that the pull-up node is high potential to turn on a pull-down control transistor, thereby realizing pull-down of a high potential of the pull-down node. Since the pull-down control transistor has a threshold voltage (Vth), the pull-down transistor only turns on, when a difference between a voltage (Vg) of the gate of the pull-down control transistor and a voltage (Vs) of the source of the pull-down control transistor is greater than Vth. Therefore, in a process of switching the pull-up node from a low potential to a high potential, when a difference between the potential of the pull-up node and the potential of the source of the pull-down control transistor is less than Vth, the pull-down control transistor cannot turn on. The high potential of the pull-down node cannot be pulled down, so that the pull-down transistor controlled by the potential of the pull-down node remains in the on state. The potential of the pull-up node is pulled down by the pull-down transistor, so that the potential of the pull-up node rises too slowly. Moreover, the pull-down transistor remains turned on when the pull-up node is charged, so that a reference low-level signal terminal conducts with a reference high-level signal terminal, which easily cause a problem of short-circuit burn.

According to embodiments of the present disclosure, a display panel includes a pixel unit and a gate driving circuit. The gate driving circuit electrically connected to the pixel unit.

The display panel includes multiple pixel units arranged in an array and multiple scanning lines. Each scanning line is electrically connected to a row of pixel units. The gate drive circuit includes multiple gate drive units cascaded in a multi-stage series. Each stage gate driving unit is electrically connected to one scanning line. The stage gate driving unit is configured to provide a driving signal to a corresponding scanning line, to control a thin film transistor in the pixel unit of the corresponding row to turn on.

The gate driving circuit in the display panel according to embodiments of the present disclosure can improve a problem that charging delay exists in a pull-up node caused by a high potential of the pull-down node not being pulled down in time.

The transistors employed in all embodiments of the present disclosure may be thin film transistors or other devices having the same characteristics. To distinguish between the two electrodes of the transistor except the gate, one of the source and the drain is referred to as a first electrode, and the other of the source and the drain is referred to as a second electrode. According to the shape in the accompanying drawings, a middle input terminal of the transistor is a gate, a signal input terminal of the transistor is a first electrode, and a signal output terminal of the transistor is a second electrode. In addition, the transistor employed in embodiments of the present disclosure is a P-type transistor or an N-type transistor. The P-type transistor turns on when the gate is low potential and turns off when the gate is high potential. The N-type transistor turns on when the gate is high potential and turns off when the gate is low potential.

As shown in FIG. 1, a gate driving circuit according to embodiments of the present disclosure includes multiple gate driving units cascaded in a multi-stage series. FIG. 1 takes a (N−1)th-stage gate driving unit GOA(n−1), an Nth-stage gate driving unit GOA(n), and an (N+1)th-stage gate driving unit GOA(n+1) which are cascaded as an example.

The (N−1)th-stage gate driving unit GOA(n−1), the Nth-stage gate driving unit GOA(n), and the (N+1)th-stage gate driving unit GOA(n+1) are connected to scanning lines G(n−1), G(n) and G(n+1) respectively. The Nth-stage gate driving unit GOA(n) accesses a cascaded scanning signal ST(n−1) output by the (N−1)th-stage gate driving unit GOA(n−1). Correspondingly, the (N+1)th-stage gate driving unit GOA(n+1) accesses a cascaded signal ST(n) output by the Nth-stage gate driving unit GOA(n), and so on. At the same time, the (N−1)th-stage gate driving unit GOA(n−1) transmits a scanning signal to a scanning line G(n−1) connected to the (N−1)th-stage gate driving unit GOA(n−1). The Nth-stage gate driving unit GOA(n) transmits the scanning signal to a scanning line G(n) connected to the Nth-stage gate driving unit GOA(n). The (N+1)th-stage gate driving unit GOA(n+1) transmits a scanning signal to the scanning line G(n+1) connected to the (N+1)th-stage gate driving unit GOA(n+1), and so on.

The first-stage gate driving unit GOA(1) transmits a scanning signal to a first scanning line G(1) connected to the first-stage gate driving unit GOA(1) in response to a start signal STV, and transmits a cascade signal ST(1) to a second-stage gate driving unit GOA(2). It should be noted that a Nth-stage gate driving unit (N is a positive integer greater than 1) may transmit a scanning signal to a Nth scanning line G(n), and transmit a cascade signal ST(n) to the (N+1)th-stage gate driving unit GOA(n+1).

A scanning driving control signal includes a first clock signal CK1 and a second clock signal CK2.

When the Nth-stage gate driving unit operates, the scanning signal output by the Nth-stage gate driving unit GOA (n) is high potential, for turning on a transistor switch of each pixel in a row in the display panel and charging a pixel electrode in each pixel by a data signal. The scanning signal is used for controlling the operation of the (N+1)th-stage gate drive unit. When the (N+1)th-stage gate driving unit operates, the scanning signal output by the (N+1)th-stage gate driving unit GOA(n+1) is high potential, at the same time, the scanning signal output by the Nth-stage gate driving unit GOA(n) is low potential.

Figure 2:
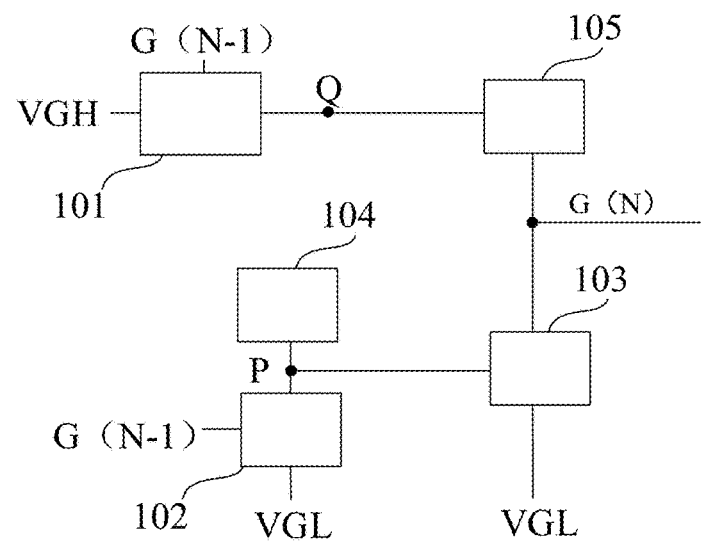
FIG. 2 is a schematic diagram of a gate driving unit in a gate driving circuit provided in FIG. 1.

As shown in FIG. 2, the gate driving unit is a non-starting-stage gate driving unit. The gate driving unit includes a pull-up control module 101, a pull-up node Q, a pull-down control module 102, a pull-down node P, and a pull-down module 103.

The pull-up control module 101 is electrically connected to a scanning signal input terminal G(N−1) of a previous one stage gate driving unit and the pull-up node Q. The pull-up control module 101 is used for pull up a potential of the pull-up node Q.

The pull-down control module 102 is not electrically connected to the pull-up node Q. Particularly, the pull-down control module 102 is electrically connected to the scanning signal input terminal G(N−1) of a previous one stage gate driving unit or a scanning signal input terminal G(N−2) of a previous two stage gate driving unit. The pull-down control module 102 is also electrically connected to the pull-down node P. The pull-down control module 102 is used for pulling down a potential of the pull-down node P.

The pull-down module 103 is electrically connected to the pull-up node Q and the pull-down node P. The pull-down module 103 is configured to pull down the potential of the pull-up node Q under control of the potential of the pull-down node P.

The gate drive unit also includes an output control module 104 and an output module 105. The output control module 104 is electrically connected to the pull-down node P. The output control module 104 is configured to pull up the potential of the pull-down node P. The output module 105 is electrically connected to the pull-up node Q. The output module 105 is configured to output the scanning signal G(N). The output module 105 may include an output transistor. The output module 105 and the output control module 104 may be the same as existing structures.

In the gate driving circuit according to embodiments of the present disclosure, the pull-down control module 102 is configured to be electrically connected to the scanning signal input terminal G(N−1) of a previous one stage gate driving unit or a scanning signal input terminal G(N−2) of a previous two stage gate driving unit, making the potential of the pull-down node is controlled by the potential of the scanning signal inputted by the scanning signal input terminal G (N−1) of a previous one stage gate driving unit or the scanning signal input terminal G(N−2) of a previous two stage gate driving unit, without being controlled by the potential of the pull-up node Q, so as to improve a problem that charging delay exists in a pull-up node Q caused by a high potential of the pull-down node P not being pulled down in time.

Figure 3:
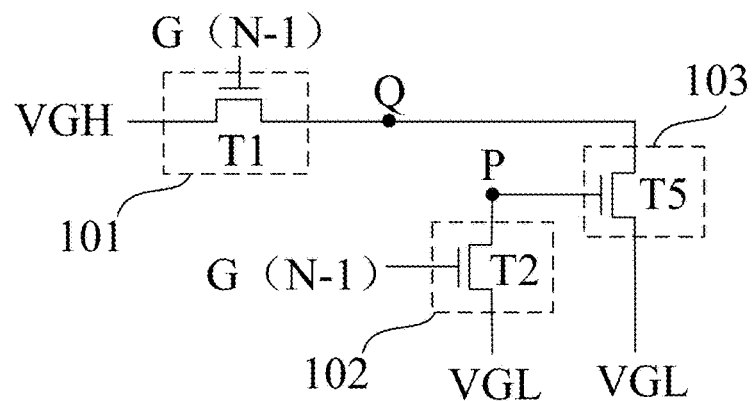
FIG. 3 is a schematic diagram of a first kind of partial circuit of a gate driving unit provided in FIG. 2.
Figure 4:
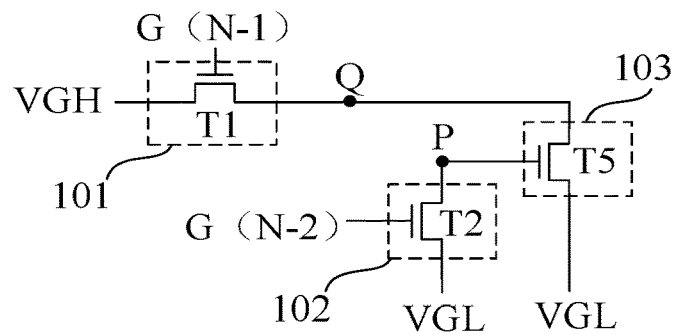
FIG. 4 is a schematic diagram of a second kind of partial circuit of a gate driving unit provided in FIG. 2.

As shown in FIG. 3 and FIG. 4, the pull-up control module 101 includes a first transistor T1. A gate of the first transistor T1 is electrically connected to the scanning signal input terminal G (N−1) of a previous one stage gate driving unit. A first electrode of the first transistor T1 is electrically connected to a reference high-level signal input terminal VGH. A second electrode of the first transistor T1 is electrically connected to the pull-up node Q.

The pull-down module 103 includes a fifth transistor T5. A gate of the fifth transistor T5 is electrically connected to the pull-down node P. A first electrode of the fifth transistor T5 is electrically connected to a reference low-level signal input terminal VGL. A second electrode of the fifth transistor T5 is electrically connected to the pull-up node Q.

As shown in FIG. 3, the pull-down control module 102 includes a second transistor T2. A gate of the second transistor T2 is electrically connected to the upper scanning signal input terminal G(N−1) of a previous one stage gate driving unit. A first electrode of the second transistor T2 is electrically connected to the reference low signal input terminal VGL. A second electrode of the second transistor T2 is electrically connected to the pull-down node P.

As shown in FIG. 4, the pull-down control module 102 includes a second transistor T2. A gate of the second transistor T2 is electrically connected to the scanning signal input terminal G(N−2) of a previous two stage gate driving unit. A first electrode of the second transistor T2 is electrically connected to the reference low-level signal input terminal VGL. A second electrode of the second transistor T2 is electrically connected to the pull-down node P.

Figure 5:
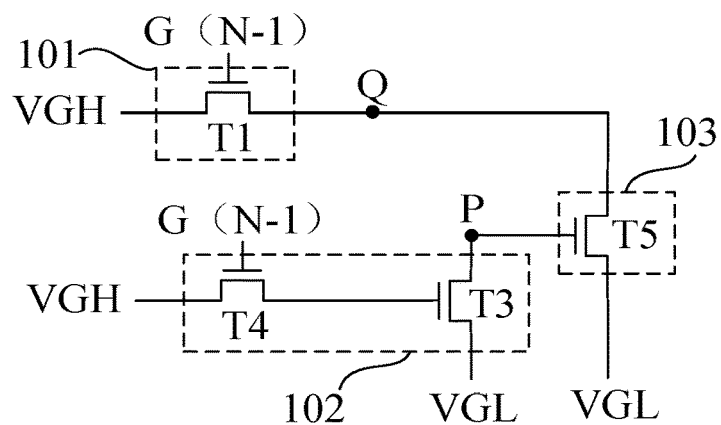
FIG. 5 is a schematic diagram of a third kind of partial circuit of a gate driving unit provided in FIG. 2.

As shown in FIG. 5, the pull-down control module 102 includes a third transistor T3, a fourth transistor T4, and a first node K.

A gate of the third transistor T3 is electrically connected to the first node K. A first electrode of the third transistor T3 is electrically connected to the reference low level signal input VGL. A second electrode of the third transistor T3 is electrically connected to the pull-down node P.

The pull-up control module 101 includes a first transistor T1. The gate of the first transistor T1 is electrically connected to the scanning signal input terminal G(N−1) of a previous one stage gate driving unit. The first electrode of the first transistor T1 is electrically connected to the reference high-level signal input terminal VGH. The second electrode of the first transistor T1 is electrically connected to the pull-up node Q.

The pull-down module 103 includes a fifth transistor T5. The gate of the fifth transistor T5 is electrically connected to the pull-down node P. The first electrode of the fifth transistor T5 is electrically connected to the reference low-level signal input terminal VGL. The second electrode of the fifth transistor T5 is electrically connected to the pull-up node Q.

The gate of the fourth transistor T4 is electrically connected to the scanning signal input terminal G(N−1) of a previous one stage gate driving unit. The first electrode of the fourth transistor T4 is electrically connected to the reference high-level signal input terminal VGH. The second electrode of the fourth transistor T4 is electrically connected to the first node K. Or, the gate of the fourth transistor T4 is electrically connected to the scanning signal input terminal G(N−2) of a previous two stage gate driving unit (not shown).

Figure 6:
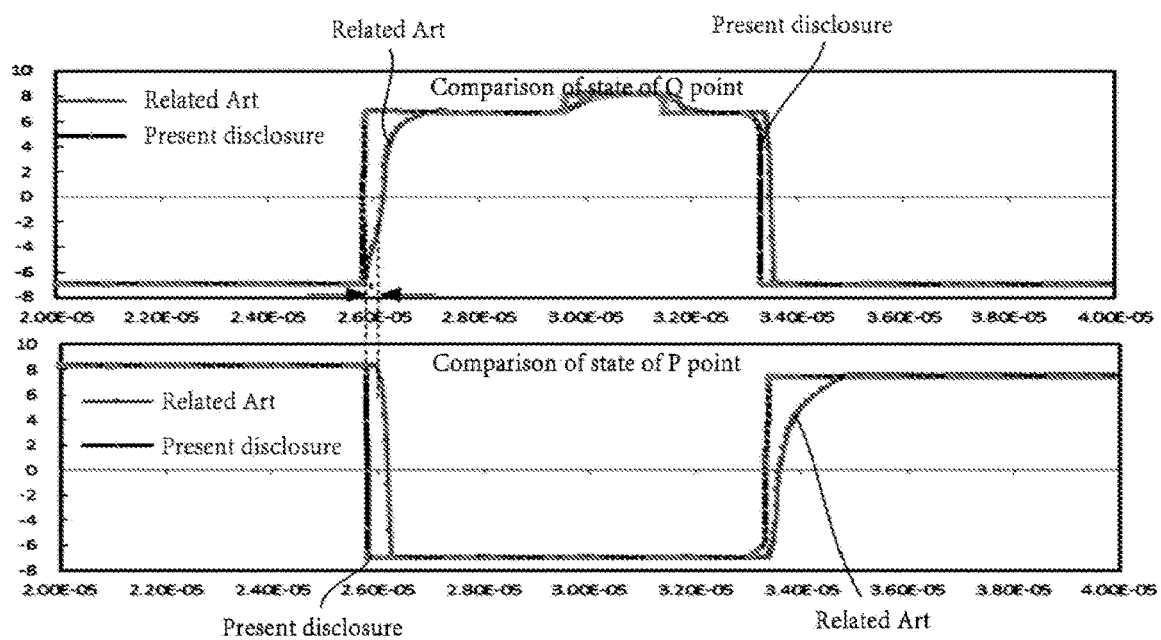
FIG. 6 is a diagram of a comparison of simulation results of a gate driving unit according to the present disclosure and a conventional gate driving unit.

As shown in FIG. 6, in existing display panel, the potential of the pull-up node Q in the stage gate driving unit needs to be pulled up until a potential difference between the pull-up node Q and the source of the pull-down control transistor is greater than a threshold voltage of the pull-down control transistor, before the pull-down control transistor can be turned on. Further, the high potential of the pull-down node P is pulled down, so as to turn the pull-down transistor off, thereby preventing the low-level signal from pulling down the potential of the pull-up node Q by the pull-down transistor. At this stage, the pull-up node Q is connected to both the high-level signal and the low-level signal, resulting in charging delay time t of the pull-up node Q, correspondingly, time delay time t when the pull-down node P is pulled down to a preset low potential. The pull-up node Q cannot be charged to a preset high potential within preset time, affecting the display effect of the display panel.

Figure 7:
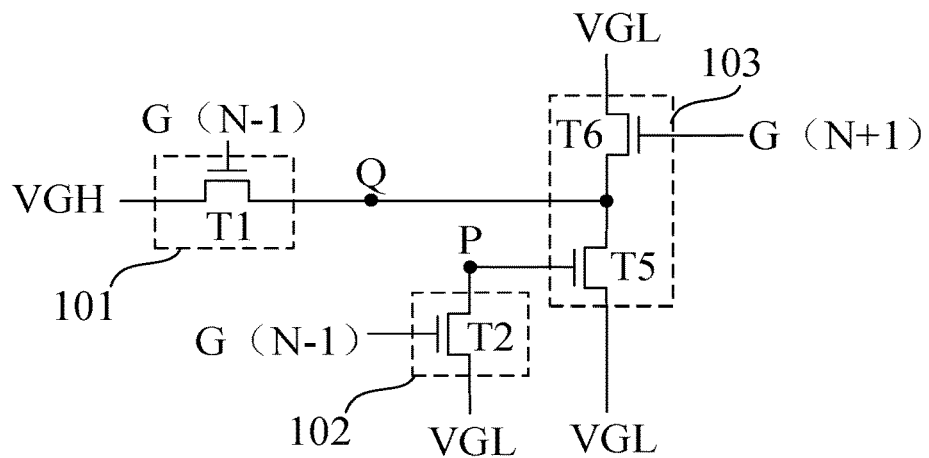
FIG. 7 is a schematic diagram of a fourth kind of partial circuit of the gate driving unit provided in FIG. 2.

As shown in FIG. 7, the pull-down module 103 includes a fifth transistor T5 and a sixth transistor T6. The gate of the fifth transistor T5 is electrically connected to the pull-down node P. The first electrode of the fifth transistor T5 is electrically connected to the reference low-level signal input terminal VGL. The second electrode of the fifth transistor T5 is electrically connected to the pull-up node Q.

The gate of the sixth transistor T6 is electrically connected to the scanning signal input terminal G(n+1) of a next one stage gate driving unit. The first electrode of the sixth transistor T6 is electrically connected to the reference low-level signal input terminal VGL. The second electrode of the sixth transistor T6 is electrically connected to the pull-up node Q.

The pull-up control module 101 includes a first transistor T1. The gate of the first transistor T1 is electrically connected to the scanning signal input terminal G(N−1) of a previous one stage gate driving unit. The first electrode of the first transistor T1 is electrically connected to the reference high-level signal input terminal VGH. The second electrode of the first transistor T1 is electrically connected to the pull-up node Q.

The pull-down control module 102 includes a second transistor T2. The gate of the pull-down control module 102 is electrically connected to the scanning signal input terminal G(N−1) of a previous one stage gate driving unit. The first electrode of the pull-down control module 102 is electrically connected to the reference low-level signal input VGL. The second electrode of the pull-down control module 102 is electrically connected to the pull-down node P. Or, the gate of the second transistor T2 is electrically connected to scanning signal input terminal G(N−2) of a previous two stage gate driving unit (not shown).

The sixth transistor T6 is provided in a gate driving unit except the last-stage gate driving unit. That is, only the last-stage gate driving unit does not include the sixth transistor T6.

In the gate driving circuit according to embodiments of the present invention, the sixth transistor T6 is added to at least part of the stage gate driving unit, so that when the stage gate driving unit completes the signal output, the potential of the pull-up node Q is ensured to be pulled down in time, preventing the phenomenon that the pixel unit in the plane is mischarged due to the fact that the high potential of the pull-up node Q still outputs the signal after the signal output is completed.

Figure 8:
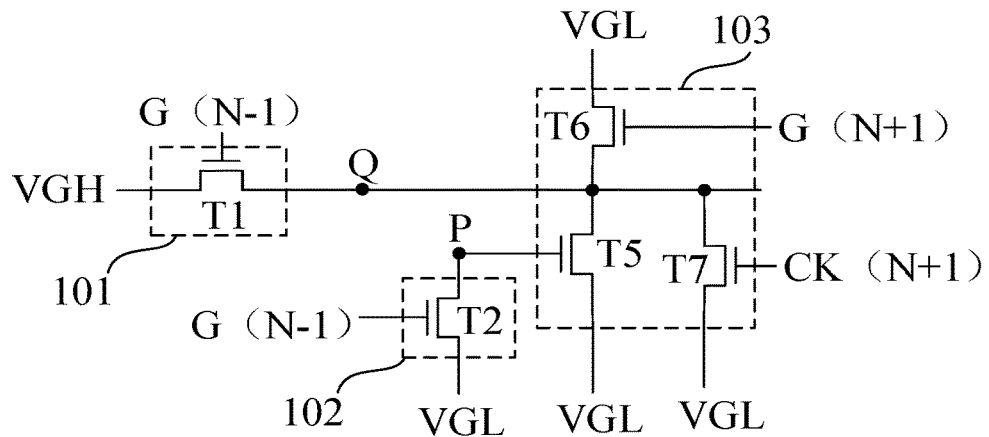
FIG. 8 is a schematic diagram of a fifth kind of partial circuit of the gate driving unit provided in FIG. 2.
Figure 9:
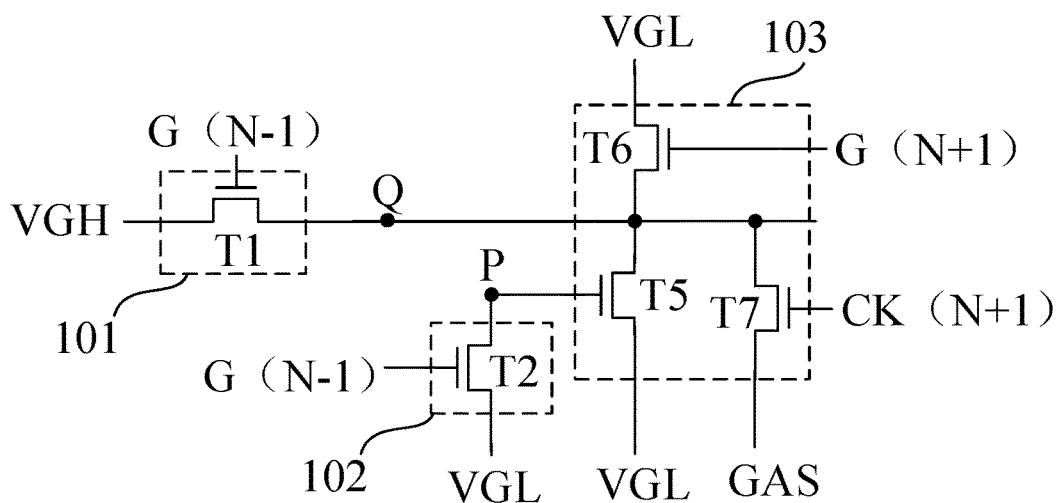
FIG. 9 is a schematic diagram of a sixth kind of partial circuit of the gate drive unit provided in FIG. 2.

As shown in FIG. 8 and FIG. 9, the pull-up control module 101 includes a first transistor T1. The gate of the first transistor T1 is electrically connected to the scanning signal input terminal G(N−1) of a previous one stage gate driving unit. The first electrode of the first transistor T1 is electrically connected to the reference high-level signal input terminal VGH. The second electrode of the first transistor T1 is electrically connected to the pull-up node Q.

The pull-down control module 102 includes a second transistor T2. The gate of the pull-down control module 102 is electrically connected to the scanning signal input terminal G(N−1) of a previous one stage gate driving unit. The first electrode of the pull-down control module 102 is electrically connected to the reference low-level signal input terminal VGL. The second electrode of the pull-down control module 102 is electrically connected to the pull-down node P. Or, the gate of the second transistor T2 is electrically connected to the scanning signal input terminal G(N−2) of a previous two stage gate driving unit (not shown). The first electrode of the second transistor T2 is electrically connected to the reference low-level signal input terminal VGL. The second electrode of the second transistor T2 is electrically connected to the pull-down node P.

The pull-down module 103 includes a fifth transistor T5, a sixth transistor T6, and a seventh transistor T7. The gate of the fifth transistor T5 is electrically connected to the pull-down node P. The first electrode of the fifth transistor T5 is electrically connected to the reference low-level signal input terminal VGL. The second electrode of the fifth transistor T5 is electrically connected to the pull-up node Q.

The gate of the sixth transistor T6 is electrically connected to scanning signal input terminal G(N+1) of a next one stage gate driving unit. The first electrode of the sixth transistor T6 is electrically connected to the reference low-level signal input terminal VGL. The second electrode of the sixth transistor T6 is electrically connected to the pull-up node Q.

As shown in FIG. 8, the gate of the seventh transistor T7 is electrically connected to the clock signal input terminal CK (N+1) of a next one stage gate driving unit. The first electrode of the seventh transistor T7 is electrically connected to the reference low-level signal input terminal VGL. The second electrode of the seventh transistor T7 is electrically connected to the pull-up node Q.

As shown in FIG. 9, the gate of the seventh transistor T7 is electrically connected to the clock signal input terminal CK (N+1) of a next one stage gate driving unit. The first electrode of the seventh transistor T7 is electrically connected to the all-gate-on control signal input terminal GAS. The second electrode of the seventh transistor T7 is electrically connected to the pull-up node Q.

The seventh transistor T7 is provided in a last stage gate driving unit.

In a gate driving circuit according to embodiments of the present disclosure, a seventh transistor T7 is added in at least part of the stage gate driving unit. The gate of the seventh transistor T7 is electrically connected to a clock signal input terminal CK(N+1) of a next one stage gate driving unit which outputs a periodic square wave signal. The period and frequency of the signal output of the clock signal input terminal CK(N+1) of a next one stage gate driving unit are the same as those of the source signal CKN of the output transistor. The phase of the clock signal input by the clock signal input terminal CK(N+1) of a next one stage gate driving unit is later than that of the source signal CKN of the output transistor. When the signal output of the stage gate driving unit is completed, the clock signal input terminal CK(N+1) of a next one stage gate driving unit inputs a high-level clock signal, so that the high potential of the pull-up node Q is pulled down to the low potential. The potential of the pull-up node Q is pulled down by a high-level clock signal input by the clock signal input CK(N+1) of a next one stage gate driving unit. At the same time, the seventh transistor T7 may be provided to prevent degradation of the performance of the pull-down transistor after operation in a severe environment or for a long time, which causes the on-state current to decay. The clock signal input by the clock signal input terminal CK(N+1) of a next one stage gate driving unit is a periodic signal. Each time the clock signal amplitude input by the clock signal input terminal CK(N+1) of a next one stage gate driving unit is high, the pull-up node Q is pulled low, thereby realizing multi-pulse output in the manner of increasing the number of pull-down times.

The above provides a detailed introduction to a gate driving circuit and display panel according to embodiments of the present disclosure. The foregoing description of embodiments of the present disclosure is merely used for helping to understand the core idea of the present disclosure, and the foregoing description should not be construed as limiting the scope of protection of the present disclosure.

What is claimed is:

1. A gate driving circuit, comprising a plurality of gate driving units cascaded in a multi-stage series, each stage gate driving units comprising: a pull-up control module;
   a pull-up node; a pull-down control module; a pull-down node; and
   a pull-down module, wherein the pull-up control module is electrically connected to the pull-up node and configured to pull up a potential of the pull-up node; the pull-down control module which disconnects to the pull-up node, is electrically connected to the pull-down node, and is configured to pull down a potential of the pull-down node; and the pull-down module is electrically connected to the pull-up node and the pull-down node, and is configured to pull down the potential of the pull-up node under control of the potential of the pull-down node, wherein the pull-down module comprises a fifth transistor;

a gate of the fifth transistor is electrically connected to the pull-down node, a first electrode of the fifth transistor is electrically connected to a reference low-level signal input terminal, and a second electrode of the fifth transistor is electrically connected to the pull-up node, wherein the pull-down module further comprises a sixth transistor;

a gate of the sixth transistor is electrically connected to a scanning signal input terminal of a next one stage gate driving unit, a first electrode of the sixth transistor is electrically connected to a reference low-level signal input terminal, and a second electrode of the sixth transistor is electrically connected to the pull-up node, and wherein the sixth transistor is provided in all stage gate driving units except a last stage gate driving unit.

2. The gate driving circuit according to claim 1, wherein the pull-up control module comprises a first transistor;

a gate of the first transistor is electrically connected to a scanning signal input terminal of a previous one stage gate driving unit, a first electrode of the first transistor is electrically connected to a reference high-level signal input terminal, and a second electrode of the first transistor is electrically connected to the pull-up node.

3. The gate driving circuit according to claim 1, wherein the pull-down control module comprises a second transistor;

a gate of the second transistor is electrically connected to a scanning signal input terminal of a previous one stage gate driving unit or a scanning signal input terminal of a previous two stage gate driving unit, a first electrode of the second transistor is electrically connected to a reference low-level signal input terminal, and a second electrode of the second transistor is electrically connected to the pull-down node.

4. The gate driving circuit according to claim 1, wherein the pull-down control module comprises a third transistor and a fourth transistor;

a first electrode of the third transistor is electrically connected to a reference low-level signal input terminal, a second electrode of the third transistor is electrically connected to the pull-down node;

a gate of the fourth transistor is electrically connected to a scanning signal input terminal of a previous one stage gate driving unit or a scanning signal input terminal of a previous two stage gate driving unit, a first electrode of the fourth transistor is electrically connected to a reference high-level signal input terminal, and a second electrode of the fourth transistor is electrically connected to a gate of the third transistor.

5. The gate driving circuit according to claim 1, wherein the pull-down module further comprises a seventh transistor;

a gate of the seventh transistor is electrically connected to a clock signal input terminal of a next one stage gate driving unit, a first electrode of the seventh transistor is electrically connected to a reference low-level signal input terminal or an all-gate-on control signal input terminal, and a second electrode of the seventh transistor is electrically connected to the pull-up node.

6. The display panel according to claim 5, wherein the seventh transistor is provided in a last stage gate driving unit.

7. The display panel according to claim 1, wherein the gate driving unit further comprises an output control module and an output module;

the output control module is electrically connected to the pull-down node, and is configured to pull up a potential of the pull-down node;

the output module is electrically connected to the pull-up node, and is configured to output a scanning signal.

8. A display panel, comprising a pixel unit and a gate driving circuit, wherein the gate driving circuit is electrically connected to the pixel unit and comprises a plurality of gate driving units cascaded in a multi-stage series, each stage gate driving units comprises: a pull-up control module; a pull-up node; a pull-down control module; a pull-down node; and a pull-down module, the pull-up control module is electrically connected to the pull-up node, and is configured to pull up a potential of the pull-up node; the pull-down control module which disconnect to the pull-up node, is electrically connected to the pull-down node, and is configured to pull down a potential of the pull-down node; and the pull-down module is electrically connected to the pull-up node and the pull-down node, and is configured to pull down the potential of the pull-up node under control of the potential of the pull-down node, wherein the pull-down module includes a fifth transistor;

a gate of the fifth transistor is electrically connected to the pull-down node, a first electrode of the fifth transistor is electrically connected to a reference low-level signal input, and a second electrode of the fifth transistor is electrically connected to the pull-up node, wherein the pull-down module further comprises a sixth transistor;

a gate of the sixth transistor is electrically connected to a scanning signal input terminal of a next one stage gate driving unit, a first electrode of the sixth transistor is electrically connected to a reference low-level signal input terminal, and a second electrode of the sixth transistor is electrically connected to the pull-up node, and wherein the sixth transistor is provided in all stage gate driving units except a last stage gate driving unit.

9. The display panel according to claim 8, wherein the pull-up control module comprises a first transistor;

a gate of the first transistor is electrically connected to a scanning signal input terminal of a previous one stage gate driving unit, a first electrode of the first transistor is electrically connected to a reference high-level signal input, and a second electrode of the first transistor is electrically connected to the pull-up node.

10. The display panel according to claim 8, wherein the pull-down control module comprises a second transistor;

a gate of the second transistor is electrically connected to a scanning signal input terminal of a previous one stage gate driving unit or a scanning signal input terminal of a previous two stage gate driving unit, a first electrode of the second transistor is electrically connected to a reference low-level signal input terminal, and a second electrode of the second transistor is electrically connected to the pull-down node.

11. The display panel according to claim 8, wherein the pull-down control module comprises:

a third transistor and a fourth transistor;

a first electrode of the third transistor is electrically connected to a reference low-level signal input terminal, a second electrode of the third transistor is electrically connected to the pull-down node; and a gate of the fourth transistor is electrically connected to a scanning signal input terminal of a previous one stage gate driving unit or a scanning signal input terminal of a previous two stage gate driving unit, a first electrode of the fourth transistor is electrically connected to a reference high-level signal input terminal, and a second electrode of the fourth transistor is electrically connected to a gate of the third transistor.

12. The display panel according to claim 8, wherein the pull-down module further comprises a seventh transistor; a gate of the seventh transistor is electrically connected to a clock signal input terminal of a next one stage gate driving unit, a first electrode of the seventh transistor is electrically connected to a reference low-level signal input terminal or an all-gate-on control signal input terminal, and a second electrode of the seventh transistor is electrically connected to the pull-up node.

13. The display panel according to claim 12, wherein the seventh transistor is provided in a last stage gate driving unit.

14. The display panel according to claim 8, wherein the gate driving unit further comprises an output control module and an output module;
   the output control module is electrically connected to the pull-down node, and is configured to pull up a potential of the pull-down node; and
   the output module is electrically connected to the pull-up node, and is configured to output a scanning signal.

\* \* \* \* \*